(12) United States Patent
Fujikura

(10) Patent No.: US 8,030,682 B2
(45) Date of Patent: Oct. 4, 2011

(54) ZINC-BLENDE NITRIDE SEMICONDUCTOR FREE-STANDING SUBSTRATE, METHOD FOR FABRICATING SAME, AND LIGHT-EMITTING DEVICE EMPLOYING SAME

(75) Inventor: Hajime Fujikura, Mito (JP)

(73) Assignee: Hitachi Cable, Ltd., Chiyoda-ku, Tokyo (JP)

( * ) Notice: Subject to any disclaimer, the term of this patent is extended or adjusted under 35 U.S.C. 154(b) by 182 days.

(21) Appl. No.: 12/000,451

(22) Filed: Dec. 12, 2007

(65) Prior Publication Data
US 2009/0050928 A1    Feb. 26, 2009

(30) Foreign Application Priority Data
Aug. 22, 2007   (JP) .................................. 2007-216222

(51) Int. Cl.
 *H01L 33/00*   (2010.01)
(52) U.S. Cl. .. 257/103; 257/102; 257/101; 257/E33.017
(58) Field of Classification Search ................... 423/409; 257/103, 102, 101, E33.017
See application file for complete search history.

(56) References Cited

U.S. PATENT DOCUMENTS

| 4,776,971 | A | * | 10/1988 | Mattera et al. | ......... 252/62.3 GA |
| 5,660,628 | A | * | 8/1997 | Sato et al. | ....................... 117/84 |
| 5,680,008 | A | * | 10/1997 | Brandes et al. | ............... 313/533 |
| 6,177,057 | B1 | * | 1/2001 | Purdy | ............................ 423/409 |
| 2006/0162768 | A1 | * | 7/2006 | Wanlass et al. | ............... 136/262 |
| 2006/0169996 | A1 | * | 8/2006 | D'Evelyn et al. | ............... 257/94 |

FOREIGN PATENT DOCUMENTS

| JP | 08-181386 | 7/1996 |
| JP | 2002-075871 | 3/2002 |
| JP | 2002-75871 A | 3/2002 |
| JP | 2002-241198 | 8/2002 |
| JP | 2002-241198 A | 8/2002 |
| JP | 2005-330132 (A) | 12/2005 |
| JP | 2002-197240 | 8/2007 |
| JP | 2007-197240 A | 8/2007 |

OTHER PUBLICATIONS

Japanese Office Action dated Nov. 17, 2009 with English-language translation.
Masahiro et al., "Incorporation of Hexagonal GaN into Cubic GaN Grown by Metalorganic Vapor Phase Epitaxy" of the Institute of Electronics, Information and Communication Engineers, Technical Report of IEICE, Nov. 6, 1998, vol. 98, 386 (CPM 98 136-150) pp. 8-12 with English-language translation.

(Continued)

*Primary Examiner* — Jerome Jackson, Jr.
*Assistant Examiner* — Dale E Page
(74) *Attorney, Agent, or Firm* — McGinn IP Law Group, PLLC

(57) ABSTRACT

A zinc-blende nitride semiconductor free-standing substrate has a front surface and a back surface opposite the front surface. The distance between the front and back surfaces is not less than 200 μm. The area ratio of the zinc-blende nitride semiconductor to the front surface is not less than 95%.

7 Claims, 8 Drawing Sheets

OTHER PUBLICATIONS

Masahiro Ogawa et al. "Incorporation of Hexagonal GaN into Cubic GaN Grown by Metalorganic Vapor Phase Epitaxy" of the Institute of Electronics, Information and Communication Engineers, Technical Report of IEICE, Nov. 6, 1998, vol. 98, 386 (CPM 98 136-150), pp. 7-12.

M. Ogawa et al., "The Role of Growth Rates and Buffer Layer Structures for Quality Improvement of Cubic GaN Grown on GaAs", Jpn. J. Appl. Phys., Feb. 1, 2001, vol. 39, Pt. 2, No. 2A, pp. L69-L72.
Japanese Patent Application No. 2007-216222 Office Action dated May 11, 2010, with partial English translation.
Chinese Office Action dated Oct. 8, 2010, with English translation.

* cited by examiner

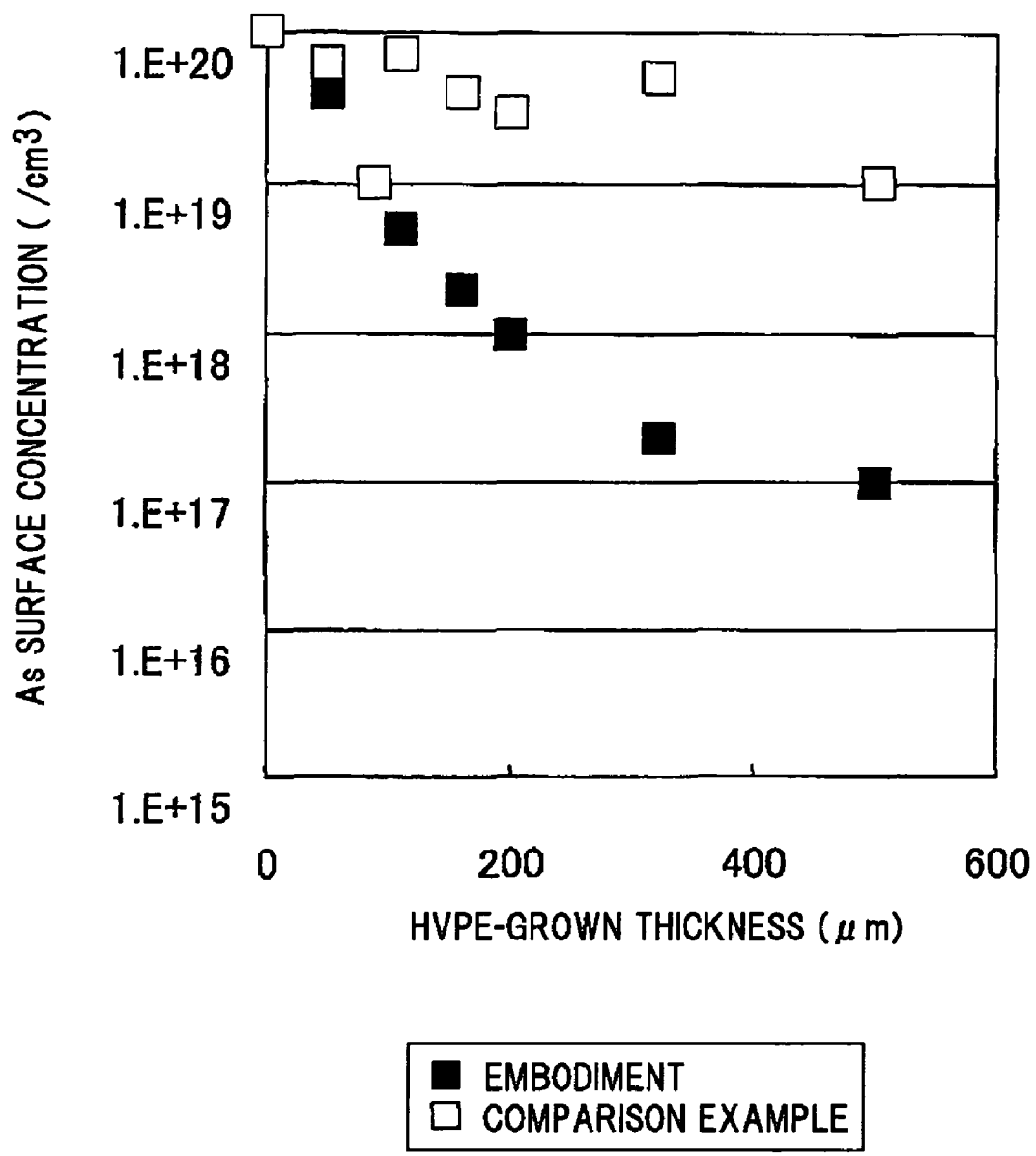

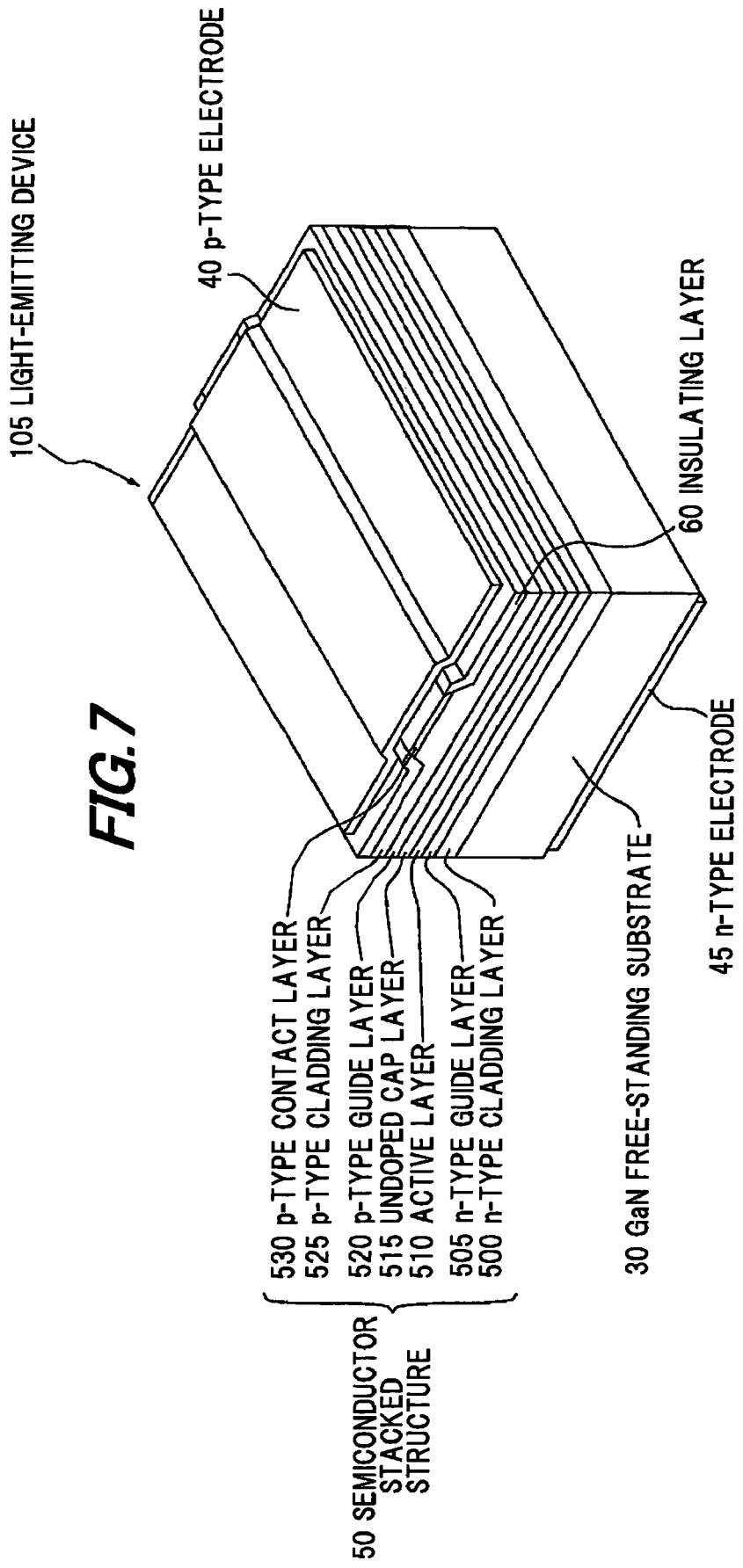

ZINC-BLENDE NITRIDE SEMICONDUCTOR FREE-STANDING SUBSTRATE, METHOD FOR FABRICATING SAME, AND LIGHT-EMITTING DEVICE EMPLOYING SAME

The present application is based on Japanese patent application No. 2007-216222 filed on Aug. 22, 2007, the entire contents of which are incorporated herein by reference.

BACKGROUND OF THE INVENTION

1. Field of the Invention

This invention relates to a zinc-blende nitride semiconductor free-standing substrate, a method for fabricating the same, and a light-emitting device employing the same.

2. Description of the Related Art

Conventionally, nitride semiconductors applied as blue, green and ultraviolet light-emitting device materials, or high power electronic device materials have wurtzite structure that belongs to hexagonal systems. The nitride semiconductors having wurtzite structure are formed by being grown on a hexagonal substrate, such as sapphire, 4H—SiC, etc. via a low-temperature GaN buffer layer, AlN buffer layer, or high-temperature AlN buffer layer. Using such wurtzite nitride semiconductors, blue violet laser diodes (LDs), blue light-emitting diodes (LEDs), green LEDs, high electron mobility transistors (HEMTs), etc. are put into practical use.

Here, the light emission power of the green LEDs formed from the nitride semiconductors with wurtzite structure is on the order of half the light emission power of the blue LEDs with the same structure. This is because the crystal quality of an active layer of the green LEDs formed from the nitride semiconductors with wurtzite structure is poor compared to the crystal quality of an active layer of the blue LEDs (emitted light wavelength: approximately 460 nm). The reason for the poor crystal quality of the active layer of the green LEDs formed from the nitride semiconductors with wurtzite structure is because the active layer of the green LEDs formed from the nitride semiconductors with wurtzite structure requires that it is formed from an InGaN layer (typically, In composition=0.25) containing more In than the blue LEDs (typically, In composition=0.15), so that the growth temperature of the active layer of the green LEDs formed from the nitride semiconductors with wurtzite structure has to be lower than that of the blue LEDs, and because of large lattice mismatch between an underlying GaN layer and the active layer. Similarly, it is difficult to produce the practical nitride semiconductor green LDs.

As one promising candidate for solving these problems, use of a zinc-blende nitride semiconductor is considered. The band gap energy of a zinc-blende GaN crystal is 3.22 eV, which is lower than the band gap energy (3.42 eV) of a wurtzite GaN crystal by 0.2 eV. Accordingly, by using the zinc-blende nitride semiconductor, enhancement of light emission efficiency of a light-emitting device can be expected. This is because when LEDs or LDs with an InGaN active layer having the same In composition are produced using wurtzite and zinc-blende nitride semiconductors, the zinc-blende structure can emit light with longer wavelength than that of the wurtzite structure because of the band gap energy difference between both.

For example, to obtain 525 nm which is a typical emitted light wavelength of the green LEDs, the In composition is required to be on the order of 0.25 for wurtzite InGaN, but may be not more than 0.2 for zinc-blende InGaN. For this reason, because a high quality InGaN layer can, when using the zinc-blende structure, be formed at higher growth temperatures and with less lattice mismatch as the active layer than when using the wurtzite structure, enhancement of light emission efficiency of the green LEDs can be expected. Further, the possibility of being able to realize the green LDs which was difficult with the wurtzite structure is high.

As a semiconductor light-emitting device using such a zinc-blende nitride semiconductor, for example, a semiconductor light-emitting device is known having a plurality of zinc-blende nitride semiconductor layers formed on a zinc-blende GaAs substrate (see, e.g., JP-A-8-181386). This semiconductor light-emitting device comprises an n-type GaAs substrate, a surface nitride layer formed on the n-type GaAs substrate, an n-type AlGaN layer formed on the surface nitride layer, a GaN/AlGaN multi-quantum well layer formed on the n-type AlGaN layer, a p-type AlGaN cladding layer formed on the GaN/AlGaN multi-quantum well layer, and a p-type GaN contact layer formed on the p-type AlGaN cladding layer. All the layers from the GaAs substrate to the p-type GaN contact layer of this semiconductor light-emitting device are constructed by the zinc-blende crystals.

However, the inventor has found that the conventional zinc-blende nitride semiconductor layers that include the nitride semiconductors forming the semiconductor light-emitting device disclosed by JP-A-8-181386 often include the wurtzite GaN layers at a proportion of not less than a few 10%. When the light-emitting device structure is grown on the GaN layers with a mixture of the zinc-blende and wurtzite structures, the nitride semiconductor active layers grown in the zinc-blende and wurtzite portions emit light with their respective different wavelengths. For this reason, even when producing a green LED, monochromatic green light cannot be emitted, but blue green light is emitted. Also, even when producing a green LD, the monochromatic property of light emitted is poor, so high gain cannot be obtained, and therefore threshold current increases to cause a problem of no laser oscillation at room temperature.

SUMMARY OF THE INVENTION

Accordingly, it is an object of this invention to provide a zinc-blende nitride semiconductor free-standing substrate, in which the zinc-blende nitride semiconductor to wurtzite nitride semiconductor ratio is high so that a practical light-emitting device can be formed, a method for fabricating the same substrate, and a light-emitting device employing the same substrate.

(1) According to one embodiment of the invention, a zinc-blende nitride semiconductor free-standing substrate comprises:

a zinc-blende nitride semiconductor;

a front surface; and a back surface opposite the front surface, wherein a distance between the front surface and the back surface is not less than 200 μm, and wherein an area ratio of the zinc-blende nitride semiconductor to the front surface is not less than 95%.

In the above embodiment (1), the following modifications and changes can be made.

(i) An As concentration in a vicinity of the front surface is not more than $1 \times 10^{19}$ cm$^{-3}$.

(ii) A dislocation density in the front surface is not more than $7 \times 10^{6}$ cm$^{-2}$.

(2) According to another embodiment of the invention, a zinc-blende nitride semiconductor free-standing substrate fabrication method comprises the steps of:

forming a low-temperature buffer layer comprising a zinc-blende nitride semiconductor in a surface of a zinc-blende GaAs substrate;

forming a zinc-blende nitride semiconductor layer on the low-temperature buffer layer; and after forming the zinc-blende nitride semiconductor layer, removing the GaAs substrate to form a zinc-blende nitride semiconductor free-standing substrate.

In the above embodiment (2), the following modifications and changes can be made.

(i) The zinc-blende nitride semiconductor free-standing substrate fabrication method further comprises the step of:

before forming the low-temperature buffer layer, forming a protective layer on the opposite side of the GaAs substrate to the surface formed with the low-temperature buffer layer.

(ii) A surface of the GaAs substrate comprises any of a (001) plane, a (111) A or B plane.

(3) According to another embodiment of the invention, a light-emitting device comprises:

a zinc-blende nitride semiconductor free-standing substrate comprising a zinc-blende nitride semiconductor, a front surface, and a back surface opposite the front surface, wherein a distance between the front surface and the back surface is not less than 200 µm, and wherein an area ratio of the zinc-blende nitride semiconductor to the front surface is not less than 95%; and a light-emitting layer formed on the zinc-blende nitride semiconductor free-standing substrate.

In the above embodiment (3), the following modifications and changes can be made.

(i) An As concentration in a vicinity of the front surface is not more than $1 \times 10^{19}$ cm$^{-3}$.

(ii) A dislocation density in the front surface is not more than $7 \times 10^6$ cm$^{-2}$.

(iii) The light-emitting layer emits green light.

According to the zinc-blende nitride semiconductor free-standing substrate fabrication method of this invention, it is possible to fabricate a zinc-blende nitride semiconductor free-standing substrate, in which the zinc-blende nitride semiconductor to wurtzite nitride semiconductor ratio is high so that a practical light-emitting device can be formed, and to provide a zinc-blende nitride semiconductor free-standing substrate fabricated by the zinc-blende nitride semiconductor free-standing substrate fabrication method, and a light-emitting device employing the same substrate.

BRIEF DESCRIPTION OF THE DRAWINGS

The preferred embodiments according to the invention will be explained below referring to the drawings, wherein:

FIG. 4 is a diagram showing a relationship between HVPE-grown film thickness and As surface concentration in the nitride semiconductor free-standing substrates fabricated by the zinc-blende nitride semiconductor free-standing substrate fabrication method in the embodiment and by the nitride semiconductor free-standing substrate fabrication method in the comparison example, respectively;

FIG. 7 is a cross-sectional view showing a green LD formed in an Applied Example using the zinc-blende nitride semiconductor free-standing substrate formed in the embodiment.

DETAILED DESCRIPTION OF THE PREFERRED EMBODIMENTS

Embodiments

FIGS. 1A-1D show a process for fabricating a zinc-blende nitride semiconductor free-standing substrate in an embodiment according to this invention.

The zinc-blende nitride semiconductor free-standing substrate fabrication method in the embodiment according to this invention fabricates a nitride semiconductor free-standing substrate of a zinc-blende type represented by $In_xAl_yGa_zN$ (where $x \geq 0$, $y \geq 0$, $z \geq 0$, $x+y+z=1$). In this embodiment, a zinc-blende GaN free-standing substrate is fabricated as one example.

Figure 1A:
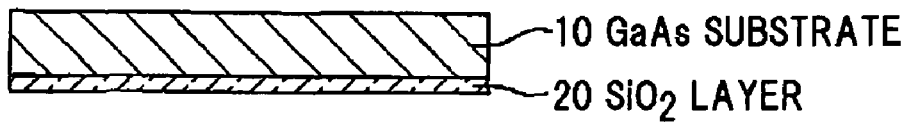
FIGS. 1A-1D are diagrams showing a process for fabricating a zinc-blende nitride semiconductor free-standing substrate in an embodiment.

First, as one example, on the backside of a 2 inch diameter GaAs substrate 10 with (001) plane is formed a 1 µm thick SiO$_2$ layer 20 as a protection layer, as shown in FIG. 1A, using vacuum deposition, sputtering, etc. And the GaAs substrate 10 with SiO$_2$ layer 20 is introduced into a metal organic vapor phase epitaxy (MOVPE) apparatus. There may be used a GaAs substrate 10 with (111) A or B plane. Also, the protection layer may be formed from SiN or the like through which at least As does not pass.

Figure 1B:
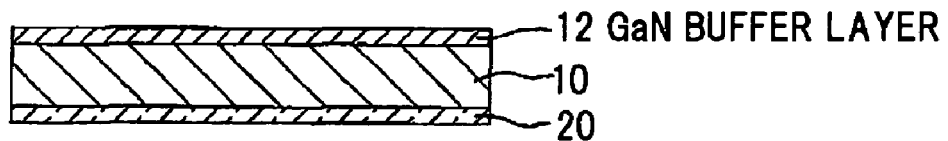

Next, the MOVPE apparatus is depressurized to $1.733 \times 10^4$ Pa (130 Torr), followed by thermal cleaning of the GaAs substrate 10 surface in a hydrogen atmosphere at 600° C. Subsequently, the atmosphere within the MOVPE apparatus is substituted with 600° C. nitrogen, and as shown in FIG. 1B, on the GaAs substrate 10 is grown an approximately 10 nm GaN crystal, i.e., a GaN buffer layer 12 as a low-temperature buffer layer. This GaN buffer layer 12 is grown at a V/III ratio of 3800, and at a growth speed of 600 nm/hour.

Figure 1C:
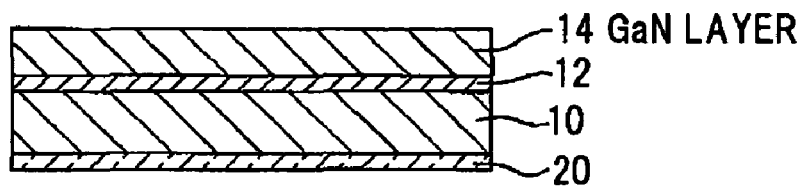

This is followed by setting the temperature of the GaAs substrate 10 to 820° C., and 5 min annealing. This annealing is followed by heating the GaAs substrate 10 up to 930° C. within the MOVPE apparatus, and growing a 1800 nm GaN layer 14 on the GaN buffer layer 12, as shown in FIG. 1C. This GaN layer 14 is grown at a V/III ratio of 52, and at a growth speed of 1800 nm/hour. Here, the growth of the GaN buffer layer 12 and the GaN layer 14 uses hydrogen-bubbled trimethyl gallium (TMG) as group III raw material, and NH$_3$ as group V raw material.

The GaN layer 14 formed at this stage is a nitride semiconductor layer formed mainly of a zinc-blende nitride. Also, in this embodiment, the wurtzite surface proportion in the GaN layer 14 is on the order of 30%, and the dislocation density is $6 \times 10^9$ cm$^2$, as one example. The zinc-blende to wurtzite ratio in the surface of the GaN layer 14 is obtained from an area ratio of 3.22 eV and 3.42 eV light emission peak regions in a cathode luminescence (CL) image. Also, the dislocation density is obtained from a density of dark points in the CL image.

Figure 1D:
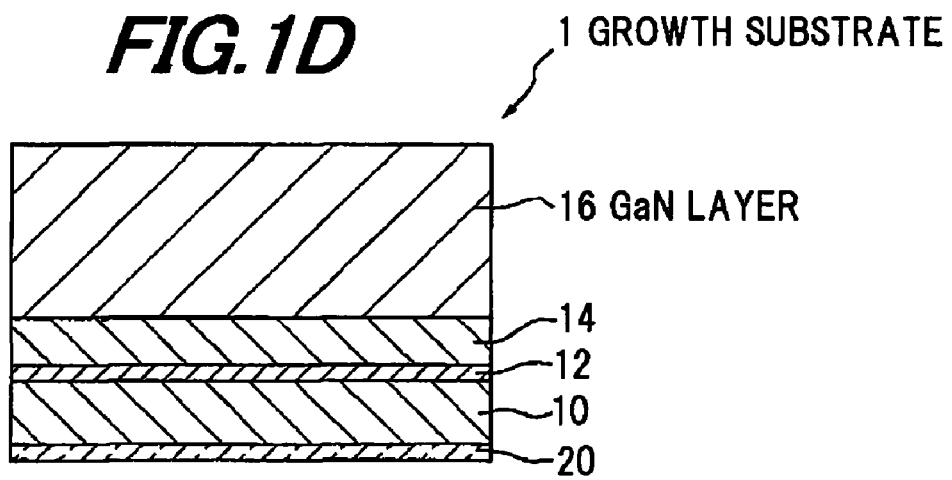

Subsequently, the GaAs substrate 10 with the GaN layer 14 formed in FIG. 1C is introduced into a halide vapor phase epitaxy (HVPE) apparatus. And as shown in FIG. 1D, on the GaN layer 14 is grown a GaN layer 16 with a specified film thickness, using HVPE. The GaN crystal growth conditions in this case are set to a nitrogen atmosphere within the HVPE furnace, a growth temperature of 950° C., a V/III ratio of 3, and a growth speed of 100 μm/our. And in this embodiment, the GaN layer 16 with varying thickness is grown. This results in a growth substrate 1.

And the GaAs substrate 10 and GaN buffer layer 12 of the growth substrate 1 are removed by grinding, etching, etc. to form a GaN free-standing substrate as a zinc-blende nitride semiconductor free-standing substrate of this invention. The GaAs substrate 10 may be etched using an etchant which is a mixture of sulfuric acid and hydrogen peroxide solution, as one example. Here, in this embodiment, the side of the GaN free-standing substrate, which was in contact with the GaAs substrate 10, is the backside of the GaN free-standing substrate, while the opposite side of the backside, i.e., the side, which was not in contact with the GaAs substrate 10, is the frontside of the GaN free-standing substrate. Accordingly, the As concentration of the frontside of the GaN free-standing substrate is lower than the As concentration of the backside thereof.

The GaN crystal growth using HVPE uses, as group III raw material, GaCl produced by causing a HCl gas to flow on a Ga metal. Also, used as group V raw material is NH$_3$. Further, in this embodiment, the GaN layer 16 is of an n-type by supplying dichlorosilane together with group III and V raw material gases during GaN crystal growth using HVPE. The dichlorosilane is supplied so that the carrier concentration of the GaN layer 16 is approximately $5 \times 10^{17}$ cm$^{-3}$.

Although the n-type zinc-blende nitride semiconductor free-standing substrate fabrication method has been described above, the zinc-blende nitride semiconductor free-standing substrate fabricated in this embodiment may be of any of an n-, i-, or p-type. And Si, Ge, O, Se, Fe, Mg, Zn, etc. may be used as a dopant.

Comparison Example to the Embodiment

Here, a zinc-blende nitride semiconductor free-standing substrate fabrication method in a comparison example to the embodiment of this invention will be explained. The zinc-blende nitride semiconductor free-standing substrate fabrication method in the comparison example forms a nitride semiconductor free-standing substrate with the same process as in the embodiment of this invention, except that there is not formed SiO$_2$ layer 20 formed on the backside of GaAs substrate 10 in the embodiment of this invention. Accordingly, details are omitted except for the difference.

The zinc-blende nitride semiconductor free-standing substrate fabrication method in the comparison example grows a GaN buffer layer 12 without forming SiO$_2$ layer 20 on the backside of GaAs substrate 10. And a GaN layer 14 is formed on the GaN buffer layer 12. This is followed by putting the GaAs substrate 10 with the GaN layer 14 in the comparison example into the HVPE furnace, and forming a GaN layer 16, as in the embodiment of this invention. This results in a nitride semiconductor free-standing substrate in the comparison example.

Figure 2:
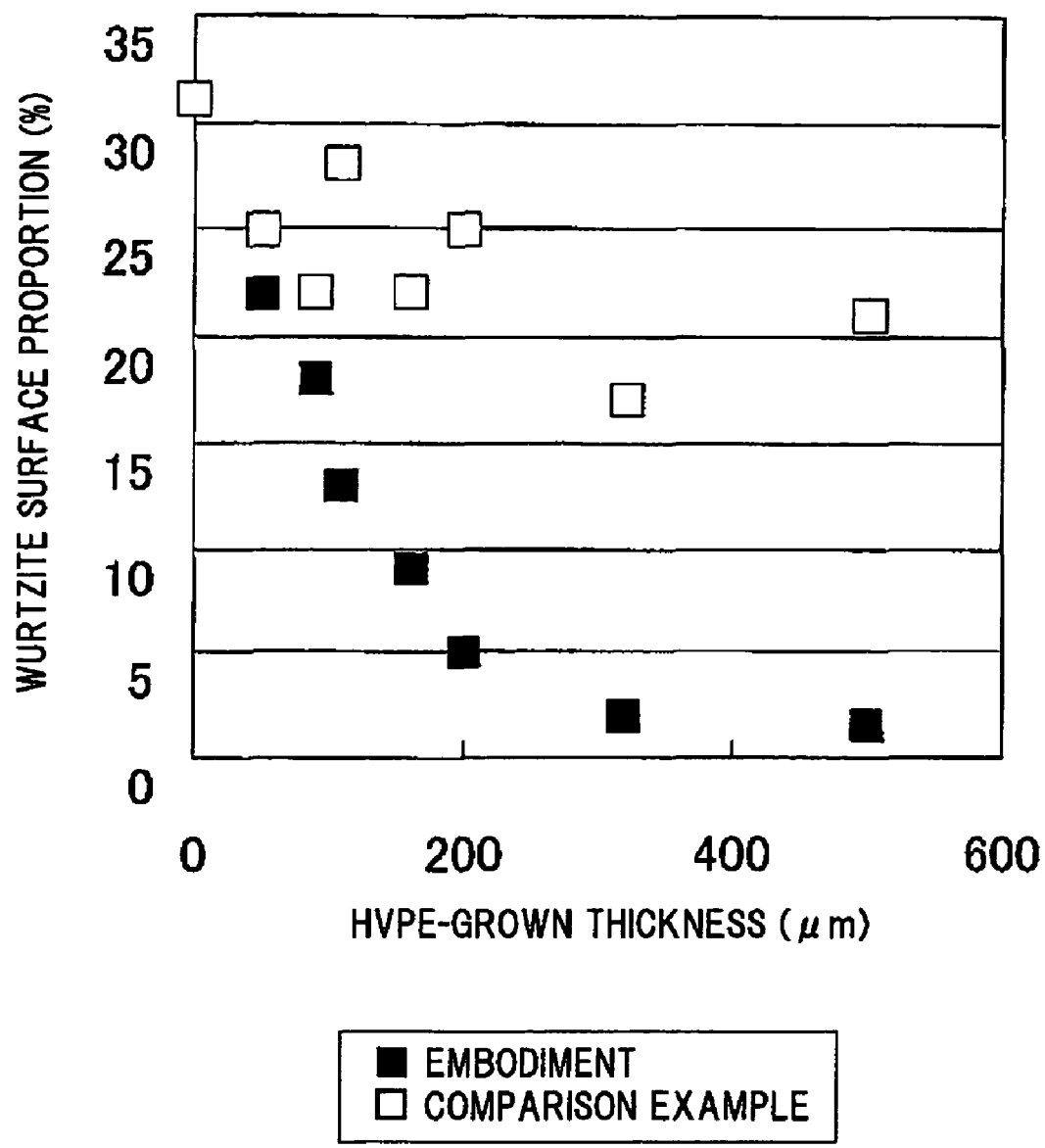
FIG. 2 is a diagram showing a relationship between HVPE-grown film thickness and wurtzite surface proportion in nitride semiconductor free-standing substrates fabricated by the zinc-blende nitride semiconductor free-standing substrate fabrication method in the embodiment and by a nitride semiconductor free-standing substrate fabrication method in a comparison example, respectively.

FIG. 2 shows a relationship between HVPE-grown film thickness and wurtzite surface proportion in the nitride semiconductor free-standing substrates fabricated by the zinc-blende nitride semiconductor free-standing substrate fabrication method in the embodiment of this invention and by the nitride semiconductor free-standing substrate fabrication method in the comparison example, respectively.

Referring to FIG. 2, the wurtzite surface proportion in the GaN free-standing substrate decreases with increasing HVPE-grown film thickness of the GaN crystal as the nitride semiconductor fabricated using the nitride semiconductor free-standing substrate fabrication method in the embodiment of this invention. Specifically, while the wurtzite surface proportion in the GaN layer 14 grown using the MOVPE apparatus is approximately 30%, the wurtzite surface proportion in the GaN layer 14 decreases below 10% at the HVPE-grown GaN layer 16 thickness of 100 μm in the embodiment of this invention. Further, when the HVPE-grown GaN layer 16 thickness increases, the wurtzite surface proportion in the GaN layer 14 decreases to 5% at the HVPE-grown GaN layer 16 thickness of 200 μm, and to 1.5% at the HVPE-grown GaN layer 16 thickness of 500 μm.

On the other hand, in the nitride semiconductor free-standing substrate fabrication method in the comparison example, when the HVPE-grown GaN layer thickness increases, the wurtzite surface proportion in the GaN layer also tends to decrease. That is, in the growth under the nitrogen atmosphere and at optimal growth temperatures below 1000° C. for wurtzite formation, it is shown that the zinc-blende GaN is more stable than the wurtzite GaN. However, in the GaN free-standing substrate obtained with the nitride semiconductor free-standing substrate fabrication method in the comparison example, the decrease in wurtzite, even when the HVPE-grown GaN layer thickness increases, is limited, compared to the GaN free-standing substrate obtained with the embodiment of this invention. Specifically, in the GaN free-standing substrate obtained in the comparison example, the wurtzite proportion is still maintained above 15% even when the HVPE-grown GaN layer thickness exceeds 200 μm.

Figure 3:
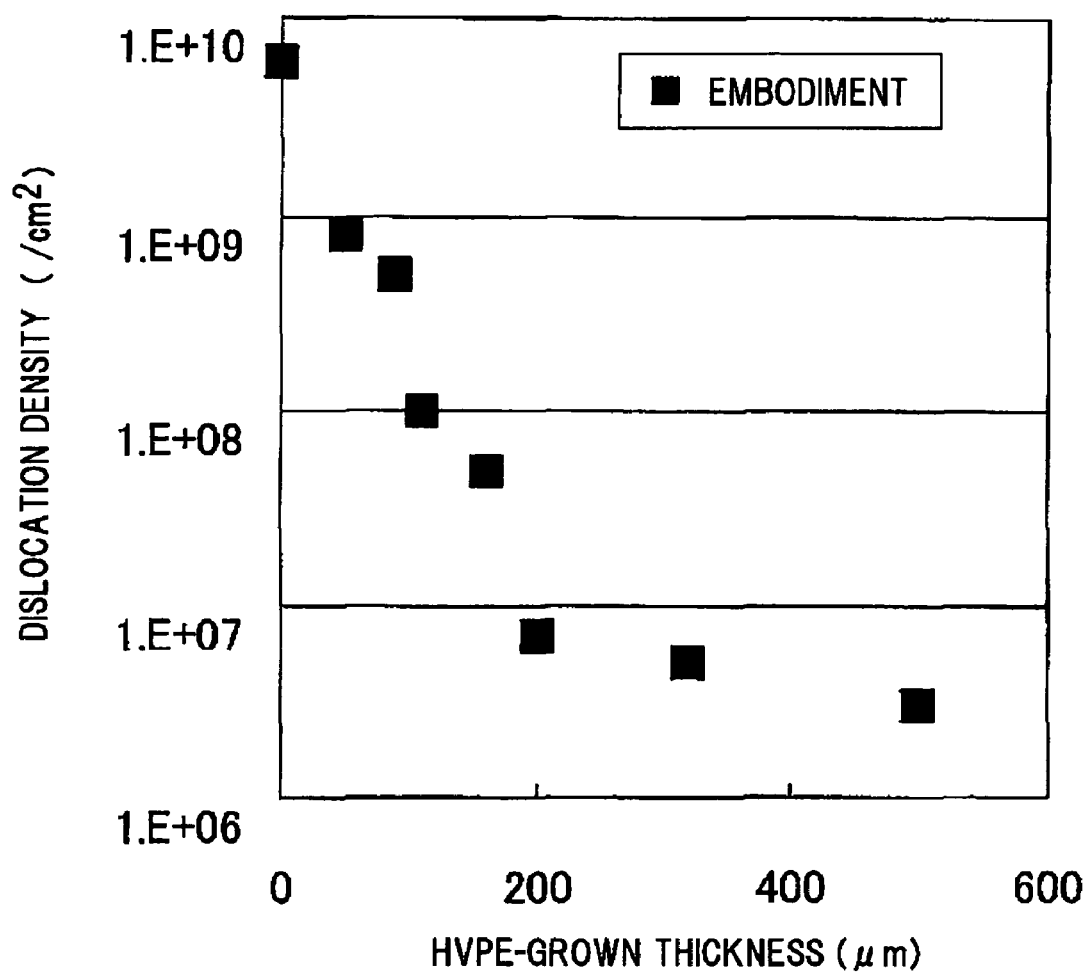
FIG. 3 is a diagram showing a relationship between HVPE-grown film thickness and surface dislocation density in the nitride semiconductor free-standing substrate fabricated by the fabrication method in the embodiment.

FIG. 3 shows a relationship between HVPE-grown film thickness and surface dislocation density in the nitride semiconductor free-standing substrate fabricated by the fabrication method in the embodiment of this invention.

Referring to FIG. 3, the surface dislocation density in the GaN layer 16 also decreases with increasing HVPE-grown GaN layer 16 thickness. Specifically, while the surface dislocation density in the GaN layer 14 grown by the MOVPE apparatus is $6 \times 10^9$ cm$^{-2}$, the surface dislocation density in the GaN layer 14 decreases to $7 \times 10^6$ cm$^{-2}$ at the HVPE-grown GaN layer 16 thickness of 200 μm, and to $3 \times 10^6$ cm$^{-2}$ at the GaN layer 16 thickness of 500 μm. From the point of view of surface dislocation density, it is shown that the zinc-blende nitride semiconductor free-standing substrate fabrication method in the embodiment of this invention can form a low-dislocation GaN free-standing substrate that can be applied to both light-emitting diodes (LEDs) and laser diodes (LDs), at HVPE-grown GaN layer 16 thicknesses of not less than 200 μm.

FIG. 4 shows a relationship between HVPE-grown film thickness and As surface concentration in the nitride semiconductor free-standing substrates fabricated by the zinc-blende nitride semiconductor free-standing substrate fabrication method in the embodiment of this invention and by the nitride semiconductor free-standing substrate fabrication method in the comparison example, respectively.

The As surface concentration in the HVPE-grown GaN layer 16 in the zinc-blende nitride semiconductor free-standing substrate fabrication method in the embodiment of this invention is measured by a Secondary Ion Mass Spectrometry (SIMS). Referring to FIG. 4, it is shown that As with as high a concentration as not less than $1 \times 10^{19}$ cm$^{-3}$ is mixed in the GaN layer 16 surface at HVPE-grown GaN layer 16 thicknesses below approximately 100 μm. And it is shown that the As surface concentration in the GaN layer 16 decreases sharply with increasing HVPE-grown GaN layer 16 thickness. As one example, the As concentration can be restricted to not less than $1 \times 10^{18}$ cm$^{-3}$ at HVPE-grown GaN layer thicknesses of not less than 200 μm.

On the other hand, it is shown that in the nitride semiconductor free-standing substrate fabrication method in the comparison example, the As surface concentration in the HVPE-grown GaN layer is as high a concentration as not less than $1 \times 10^{19}$ cm$^{-3}$, regardless of HVPE-grown GaN layer thickness.

The results of FIGS. 2-4 show that, in order to rapidly reduce the wurtzite to zinc-blende proportion in the GaN layer 16 surface, it is very important to reduce the arsenic (As) concentration in the GaN layer 16 growth surface. That is, the embodiment of this invention allows As to be prevented from being evaporated from the backside of GaAs substrate 10 by forming SiO$_2$ layer 20 on the backside of GaAs substrate 10 as a protection layer, and thereby makes it possible to reduce As mixed into the zinc-blende nitride semiconductor free-standing substrate.

Further, by increasing the HVPE-grown GaN layer 16 thickness, the As concentration in the GaN layer 16 growth surface can be decreased. Where the thickness of the GaN layer 16 as the nitride semiconductor layer is thinner than 100 μm, not less than $1 \times 10^{19}$ cm$^{-3}$ As diffuse from GaAs substrate 10 to GaN layer 16. And the wurtzite surface proportion in the GaN layer is high compared to when the As surface concentration in the GaN layer is not more than $1 \times 10^{18}$ cm$^{-3}$.

From this, the inventor has considered that the factor of substantially reducing the wurtzite proportion in the GaN layer 16 surface is to reduce the As concentration in the GaN layer 16 surface to not more than a specified concentration. Here, the specified concentration is $1 \times 10^{19}$ cm$^{-3}$. Substantially the same results as in FIGS. 2-4 are obtained even when the GaN free-standing substrate fabricated using a GaAs substrate 10 whose frontside is a (111) A or B plane is used.

Here, although the mechanism has not been elucidated in detail that reduces the wurtzite proportion in the GaN layer 16 surface when the As concentration in the GaN layer 16 surface is reduced, this inventor has assumed, from the knowledge that wurtzite GaN crystals are not planar-grown when doped with a high concentration of Si, that the form of a growing GaN crystal is changed by mixing a high concentration of impurity. And the inventor has assumed that, in the comparison example, the wurtzite GaN crystal is more stable than the zinc-blende GaN crystal due to the presence of the high concentration of As.

Advantages of the Embodiment

According to the zinc-blende nitride semiconductor free-standing substrate fabrication method in the embodiment of this invention, it is possible to form a zinc-blende nitride semiconductor free-standing substrate which is not less than 200 μm in thickness, not more than 5% in the wurtzite nitride semiconductor proportion in the entire surface of the nitride semiconductor free-standing substrate, and not more than $1 \times 10^{19}$ cm$^{-3}$ in the As surface concentration in the nitride semiconductor free-standing substrate. That is, according to this embodiment, it is possible to form a nitride semiconductor free-standing substrate which is formed mainly of zinc blende. This allows the fabrication of light-emitting devices, such as LEDs, LDs, etc., with good monochromatic light emission, using the nitride semiconductor free-standing substrate formed in this embodiment.

Also, according to the zinc-blende nitride semiconductor free-standing substrate fabrication method in the embodiment of this invention, the HVPE-formed nitride semiconductor having a thickness of not less than 200 μm allows the zinc-blende nitride semiconductor free-standing substrate formed to have a surface dislocation density of $7 \times 10$ cm$^{-2}$. Accordingly, the zinc-blende nitride semiconductor free-standing substrate formed in the embodiment of this invention can be used in the fabrication of practical light-emitting devices, such as LEDs, LDs, etc.

Applied Example 1

Figure 5A:
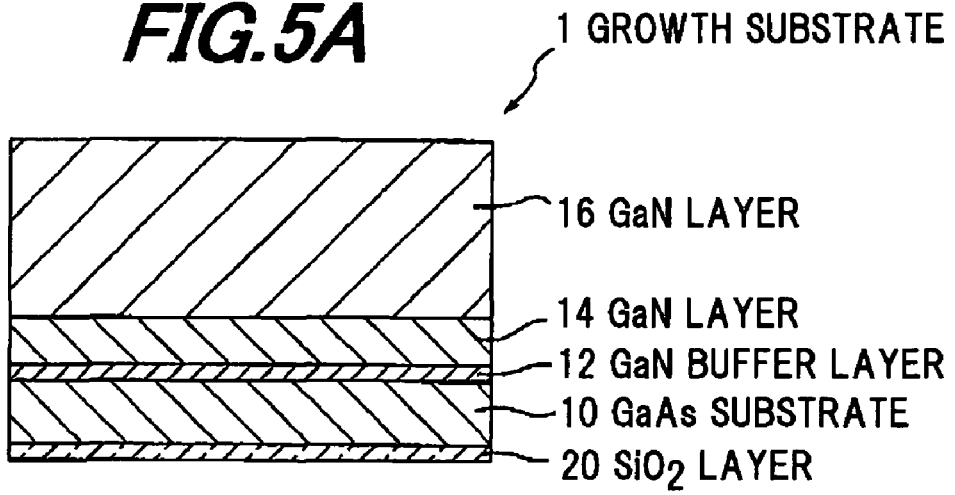
FIGS. 5A-5C are diagrams showing an Applied Example showing a process for forming a green LED structure on the zinc-blende nitride semiconductor free-standing substrate formed in the embodiment.
Figure 5B:
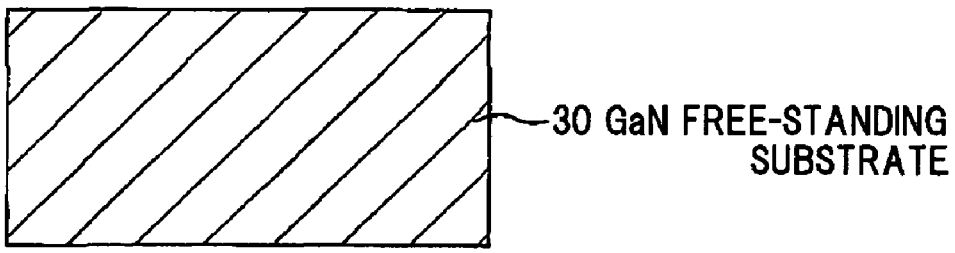
Figure 5C:
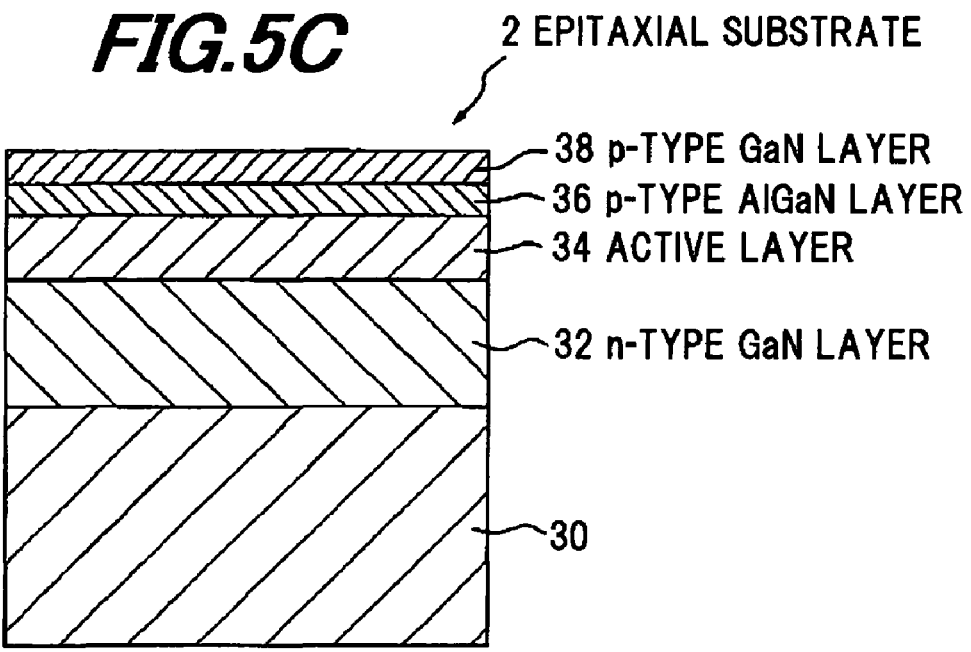

FIGS. 5A-5C show an Applied Example showing a process for forming a green LED structure on the zinc-blende nitride semiconductor free-standing substrate formed in the embodiment of this invention.

First, as shown in FIG. 5A, a growth substrate 1 shown in FIG. 1D is formed. And a GaAs substrate 10 of the growth substrate 1 is removed by etching, which results in a GaN free-standing substrate 30 as a zinc-blende nitride semiconductor free-standing substrate, as shown in FIG. 5B.

Next, as shown in FIG. 5C, on the GaN free-standing substrate 30 is formed a green LED semiconductor stacked structure, using MOVPE. Specifically, on the GaN free-standing substrate 30 is first formed an n-type GaN layer 32. The n-type GaN layer 32 is grown at 940° C. by being doped with a specified concentration of Si as a dopant, as one example. The n-type GaN layer 32 is formed 2 nm thick, as one example.

This is followed by growing an active layer 34 on the n-type GaN layer 32. Concretely, the active layer 34 has a multi-quantum well structure including 3 pairs of InGaN/GaN layers. The active layer 34 is grown at 700° C., as one example. And the InGaN well layer of the InGaN/GaN layers is formed so that it is 3 nm thick and the In composition is 0.18, as one example. Also, the GaN barrier layer is formed 10 nm thick, as one example.

This is followed by forming a p-type AlGaN layer 36 on the active layer 34. The p-type AlGaN layer 36 is grown at 940° C. The p-type AlGaN layer 36 is formed 60 nm thick, as one example. Further, on the p-type AlGaN layer 36 is formed a p-type GaN layer 38. The p-type GaN layer 38 is formed 200 nm thick, as one example. As a p-type dopant, Mg may be used as one example. This results in an epitaxial substrate 2 with a green LED structure formed on the GaN free-standing substrate 30.

Figure 5D:
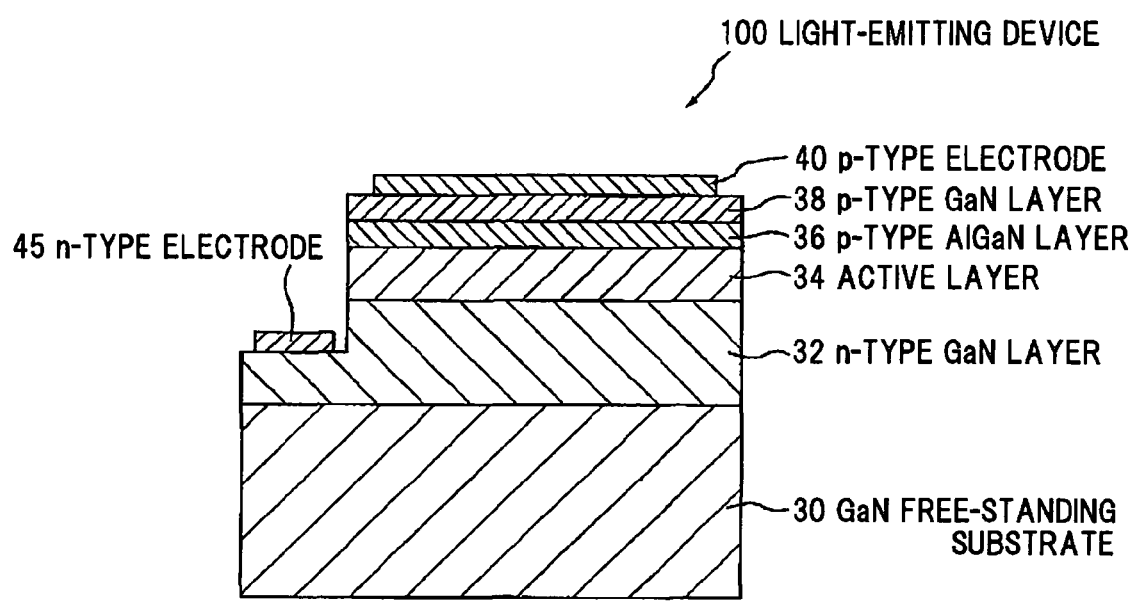
FIG. 5D is a cross-sectional view showing the green LED formed in the Applied Example using the zinc-blende nitride semiconductor free-standing substrate formed in the embodiment.

FIG. 5D shows the green LED formed in the Applied Example using the zinc-blende nitride semiconductor free-standing substrate formed in the embodiment of this invention.

A light-emitting device 100 as the green LED in the Applied Example includes a GaN free-standing substrate 30, an n-type GaN layer 32 formed on the GaN free-standing substrate 30, an active layer 34 formed in a specified region on the n-type GaN layer 32, a p-type AlGaN layer 36 formed on the active layer 34, a p-type GaN layer 38 formed on the p-type AlGaN layer 36, an n-type electrode 45 formed in a specified region formed by partially removing (e.g., etching) the n-type GaN layer 32, and a p-type electrode 40 formed in a specified region of the surface of the p-type GaN layer 38.

The light-emitting device 100 in the Applied Example is formed using the epitaxial substrate 2 obtained in FIGS. 5A-5C. Specifically, a region for forming the n-type electrode 45 is formed in a specified region on the epitaxial substrate 2 using photolithography and reactive ion etching (RIE). Specifically, the n-type GaN layer 32 is partially exposed by RIE from the p-type GaN layer 38 to portion of the n-type GaN layer 32 of the epitaxial substrate 2.

This is followed by forming a Ti/Al electrode in a specified position of the exposed n-type GaN layer 32 as the n-type electrode 45 using photolithography and vacuum deposition. Further, a Ni/Au semitransparent electrode is formed in a specified position of the p-type GaN layer 38 as the p-type electrode 40 using photolithography and vacuum deposition. This results in the light-emitting device 100 as a green LED.

Table 1 shows properties of the light-emitting device in the Applied Example formed in FIG. 5D and properties of the zinc-blende nitride semiconductor free-standing substrate used in the light-emitting device formed.

TABLE 1

| | Free-standing substrate properties | | LED properties | | |
|---|---|---|---|---|---|
| HVPE-grown thickness (μm) | Wurtzite surface proportion (%) | Dislocation density (/cm$^2$) | LED light color | LED power (mW@20 mA) | Lifetime (hour) |
| 160 | 9 | 5 × 10$^7$ | Blue green | 8.3 | 100 |
| 200 | 5 | 7 × 10$^6$ | Green | 10.5 | 4900 |
| 320 | 2 | 5 × 10$^6$ | Green | 11.5 | 4900 |
| 500 | 1.5 | 3 × 10$^6$ | Green | 11.2 | 5000 |

When a green LED is formed using the GaN free-standing substrate 30 with a thickness of not less than 200 μm and having the InGaN well layer with the In composition of 0.18, the light-emitting device 100 in Applied Example 1 provides green light emission in spite of its In composition lower than the In composition (~0.25) of a conventional wurtzite GaN-based green LED. The central wavelength of light emitted by the light-emitting device 100 is 525 nm, which is the same as that of the conventional green LED. Also, the light emission power during 20 mA electrical conduction of the conventional wurtzite GaN-based green LED is approximately 5 mW, whereas that of the light-emitting device 100 in Applied Example 1 is not less than 10 mW, which is not less than twice that of the conventional green LED.

This light emission power value is the same or more than that of the conventional wurtzite GaN-based blue LED. Accordingly, it is shown that where the active layer 34 including the InGaN well layer is formed on the nitride semiconductor free-standing substrate produced by the nitride semiconductor free-standing substrate fabrication method according to this invention, it is possible to form the active layer 34 having crystal quality that is the same or more than that of the conventional blue LED.

On the other hand, when the light-emitting device 100 is formed using the GaN free-standing substrate 30 with an HVPE-grown GaN layer thickness of less than 200 μm, its light emission power is higher than that of the conventional green LED, but its emitted light color is not pure green, but blue green. When the HVPE-grown GaN layer thickness is less than 200 μm, a specified proportion of wurtzite GaN is contained in the HVPE-grown GaN layer surface. And, on the wurtzite GaN layer is formed a wurtzite InGaN active layer, and this wurtzite InGaN active layer shines blue. Accordingly, where the GaN free-standing substrate is thin and the wurtzite GaN surface proportion is higher than a specified proportion, it is difficult to obtain pure green light emission.

Also, in comparison of device lifetime (defined as a time when light emission power is 80% of initial light emission power during 50 mA electrical conduction), a device lifetime of not less than 4000 hours is possible at a practical level for a GaN free-standing substrate thickness of not less than 200 μm, but the device lifetime is as very short as on the order of 100 hours for a GaN free-standing substrate thinner than 200 μm. This is because when the GaN free-standing substrate is thinner than a specified thickness, the surface dislocation density of the GaN free-standing substrate is high and therefore device deterioration accelerates, and the As surface concentration in the GaN free-standing substrate is high and therefore As diffuses into the active layer during electrical conduction, causing acceleration in device deterioration.

The above results show that only the GaN free-standing substrate with a HVPE-grown GaN layer thickness of not less than 200 μm can be used as an underlying substrate of green LEDs that emits green light including 525 mm wavelength light. That is, when the wurtzite surface proportion in the GaN free-standing substrate is not more than 5%, the monochromatic property of the InGaN active layer formed on its surface is very good compared with when the wurtzite proportion is a few 10%, and therefore the zinc-blende nitride semiconductor free-standing substrate in the embodiment of this invention can fully be applied to practical devices such as light-emitting devices.

In a GaN free-standing substrate with a thickness of less than 160 μm, there is a high possibility of being broken during etching for removing the GaAs substrate 10 and during conveyance to the MOVPE apparatus. Accordingly, because it is difficult to use the GaN free-standing substrate with a thickness of less than 160 μm as the underlying substrate for semiconductor layer growth, no green LED structure is grown, and no light-emitting device 100 in Applied Example is formed.

Modification of Applied Example 1

Formation of the GaN free-standing substrate 30 as the zinc-blende nitride semiconductor free-standing substrate as shown in FIG. 5B is followed by grinding the frontside and backside of the GaN free-standing substrate 30 and forming a GaN free-standing substrate with mirror surface on both its sides. And using the GaN free-standing substrate with mirror surface on both its sides, a green LED is produced as in Applied Example 1. The green LED in modification of Applied Example 1 produced shows substantially the same results as in Applied Example 1.

Further, formation of the GaN free-standing substrate 30 as the zinc-blende nitride semiconductor free-standing substrate as shown in FIG. 5B is followed by mirror-grinding the frontside of the GaN free-standing substrate 30 and forming a GaN free-standing substrate with lapped surface (non-mirror surface) on its backside. Using this GaN free-standing substrate, a green LED is produced as in Applied Example 1 that also shows substantially the same results as in Applied Example 1. Substantially the same results are obtained even when the GaN free-standing substrate fabricated using a GaAs substrate 10 whose frontside is a (111) A or B plane is used.

Comparison Example to Applied Example 1

Figure 6A:
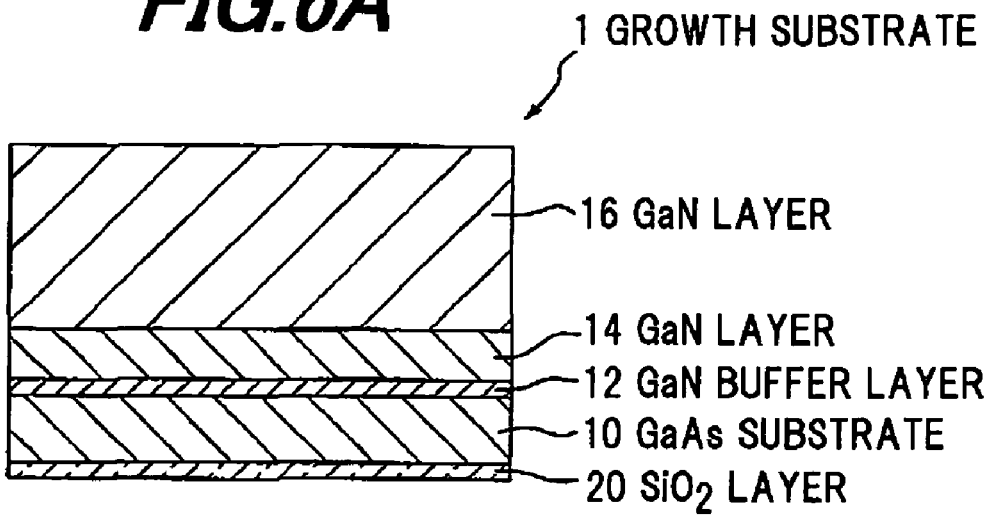
FIGS. 6A and 6B are diagrams showing a process for forming a green LED structure on a nitride semiconductor free-standing substrate in a comparison example to the Applied Example.
Figure 6B:
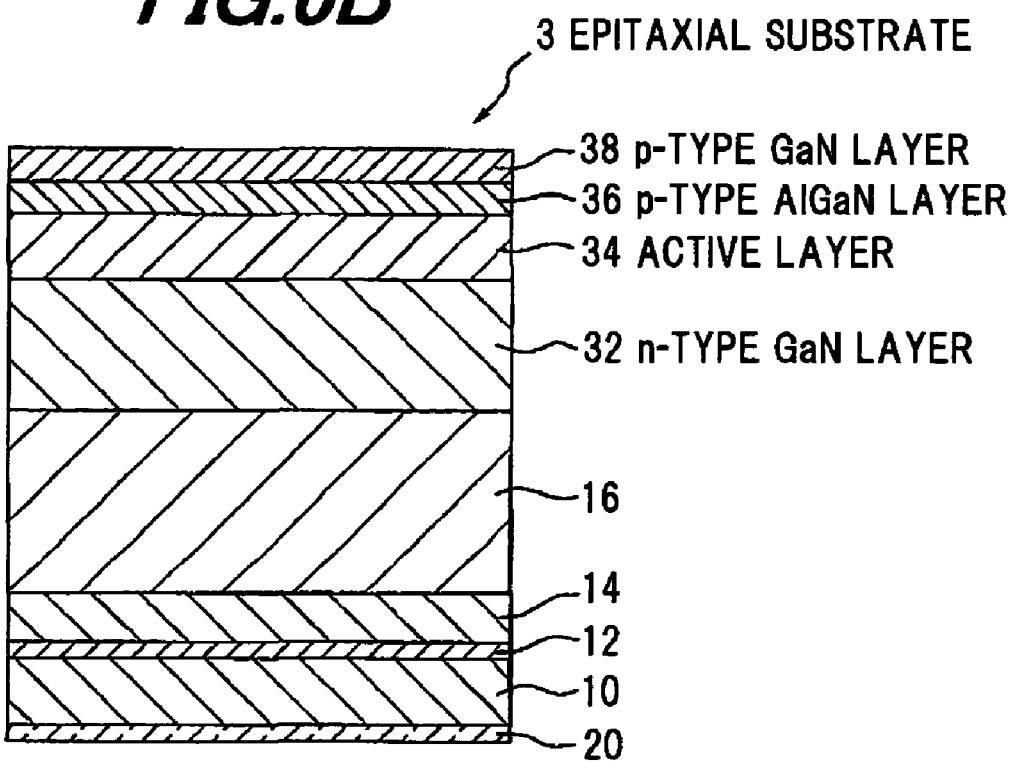

FIGS. 6A and 6B show a process for forming a green LED structure on a nitride semiconductor free-standing substrate in a comparison example to the Applied Example of this invention.

In Applied Example 1, as shown in FIG. 5A, the GaAs substrate 10 of the growth substrate 1 shown in FIG. 1D is removed by etching, which results in the GaN free-standing substrate 30 as the zinc-blende nitride semiconductor free-standing substrate, as shown in FIG. 5B. On the other hand, in the comparison example to the Applied Example 1, a green LED structure is formed on the GaN layer 16 as in Applied Example 1, without removing the GaAs substrate 10. The comparison example to the Applied Example 1 produces the green LED structure with substantially the same process as in Applied Example 1, except that the GaAs substrate 10 is not removed. Accordingly, its details are omitted.

In the comparison example to the Applied Example 1, with the GaAs substrate 10 not removed, the green LED structure is formed on the GaN layer 16, as shown in FIG. 6B. This results in an epitaxial substrate 3. Subsequently, a light-emitting device is formed as in Applied Example 1. Specifically, a region for forming an n-type electrode is formed in a specified region on the epitaxial substrate 3 using photolithography and RIE. Specifically, the n-type GaN layer 32 is partially exposed by RIE from the p-type GaN layer 38 to portion of the n-type GaN layer 32 of the epitaxial substrate 3.

This is followed by forming a Ti/Al electrode in a specified position of the exposed n-type GaN layer 32 as the n-type electrode using photolithography and vacuum deposition. Further, a Ni/Au semitransparent electrode is formed in a specified position of the p-type GaN layer 38 as the p-type electrode using photolithography and vacuum deposition. This results in a light-emitting device in the comparison example to Applied Example 1.

The light emission power of the LED as the light-emitting device in the comparison example to Applied Example 1 is not more than 2 mW, and its lifetime is not more than 50 hours. The inventor assumes that the low light emission power of the light-emitting device in the comparison example to Applied Example 1 is caused by the GaAs substrate 10 absorbing light emitted by the active layer 34. Accordingly, after producing the light-emitting device in the comparison example to Applied Example 1, the GaAs substrate 10 is removed and light emission power is measured again. Consequently, the light emission power increases by the order of 5 mW. However, this light emission power is on the order of half the light emission power of the light-emitting device 100 in Applied Example 1. This is considered to be because, when the nitride semiconductor is grown on the GaN layer 16 in the presence of the GaAs substrate 10 using the MOVPE apparatus, the crystallinity of the InGaN active layer decreases more than in the absence of the GaAs substrate 10. This consideration is also supported by the lifetime of the light-emitting device in the comparison example to Applied Example 1 being as very short as 50 hours.

When analyzing an impurity concentration around the active layer of the light-emitting device in the comparison example to Applied Example 1, a high concentration of As exceeding $5 \times 10^{18}$ cm$^3$ is contained within the active layer. Accordingly, the high concentration of As within the active layer is considered to cause the decrease in the crystallinity of the InGaN active layer. This is because the semiconductor layer growth speed with the MOVPE apparatus is on the order of $1/100$ of the semiconductor layer growth speed with HVPE, and when the nitride semiconductor layer is grown within the MOVPE apparatus in the presence of the GaAs substrate 10, the nitride semiconductor layer together with the GaAs substrate 10 is placed for a long time within the same apparatus, and a large amount of As is therefore mixed from the GaAs substrate 10 into the growth layer.

The above results show that, to produce the underlying substrate for light-emitting devices (LEDs, LDs) with practical green light emission power, the GaAs substrate 10 has to be removed after forming the GaN layer 16 on the GaAs substrate 10 as a seed crystal with SiO$_2$ layer 20 on its backside. That is, it is shown that the GaN free-standing substrate obtained by removing the GaAs substrate 10 has to be used as the underlying substrate of the light-emitting device. Substantially the same results are obtained even when the GaN free-standing substrate fabricated using a GaAs substrate 10 whose frontside is a (111) A or B plane is used.

Applied Example 2

FIG. 7 shows a green LD formed in an Applied Example using the zinc-blende nitride semiconductor free-standing substrate formed in the embodiment of this invention.

A light-emitting device 105 as the green LD in Applied Example 2 of this invention includes a GaN free-standing substrate 30, a semiconductor stacked structure 50 formed on the GaN free-standing substrate 30, an insulating layer 60 formed in a specified region on an opposite side of the semiconductor stacked structure 50 to the side adjacent to the GaN free-standing substrate 30, a p-type electrode 40 electrically connected in a region with the insulating layer 60 not formed to the semiconductor stacked structure 50, and an n-type electrode 45 formed in substantially the entire surface on an opposite side of the GaN free-standing substrate 30 to the side formed with the semiconductor stacked structure 50.

Specifically, the semiconductor stacked structure 50 includes an n-type cladding layer 500 formed on the GaN free-standing substrate 30, an n-type guide layer 505 formed on the n-type cladding layer 500, an active layer 510 formed on the n-type guide layer 505, an undoped cap layer 515 formed on the active layer 510, a p-type guide layer 520 formed on the undoped cap layer 515, a p-type cladding layer 525 formed on the p-type guide layer 520, and a p-type contact layer 530 formed in a stripe shape in a specified region on the p-type cladding layer 525.

A ridge is formed in a region with the p-type contact layer 530 on the p-type cladding layer 525. And on the ridge of the p-type cladding layer 525 is formed the p-type contact layer 530. Further, on the p-type cladding layer 525 is formed the insulating layer 60 in a region except on the ridge and with p-type contact layer 530 not formed.

The semiconductor stacked structure 50 is formed by MOVPE. As one example, the n-type cladding layer 500 may be formed from an n-type AlGaN/n-type GaN superlattice, and the n-type guide layer 505 may be formed from an n-type GaN layer. Also, the active layer 510 may be formed from a multi-quantum well structure including $In_{1-x}Ga_xN/In_{1-y}Ga_yN$ ($0 \leq y \leq x < 1$) semiconductor layer. And the undoped cap layer 515 may be formed from an undoped AlGaN layer, and the p-type guide layer 520 may be formed from a p-type GaN layer. Further, the p-type cladding layer 525 may be formed from a p-type AlGaN/p-type GaN superlattice, and the p-type contact layer 530 may be formed from a p+-type GaN layer.

The light-emitting device 105 as an LD with such structure oscillates at room temperature as a green laser only when the HVPE-formed GaN layer, i.e., the GaN free-standing substrate 30 is not less than 200 µm thick. The oscillation start current of this light-emitting device 105 is 23 mA, the oscillation wavelength 525 nm, and light emission power is 10 mW. Also, the operating voltage of the light-emitting device 105 is 5.1V, and the operating current is 30 mA. Substantially the same results are obtained even when the GaN free-standing substrate fabricated using a GaAs substrate 10 whose frontside is a (111) A or B plane is used.

In each of the embodiment of this invention, the Applied Examples 1 and 2 of this invention, its semiconductor material forming the nitride semiconductor free-standing substrate is varied from GaN to AlN, AlGaN, InGaN, or InAlGaN. Consequently, when the constituent material of the zinc-blende nitride semiconductor free-standing substrate is $In_xAl_yGa_zN$ ($x \geq 0$, $y \geq 0$, $z \geq 0$, $x+y+z=1$), substantially the same results are obtained as in each of the embodiment of this invention, the Applied Examples 1 and 2 of this invention. It should however be noted that it is necessary to select, as a nitride semiconductor free-standing substrate for a light-emitting device, a semiconductor material having a band gap energy matched to a light wavelength emitted by the light-emitting device.

The embodiments of this invention have been described, but should not be construed to limit claimed inventions. Also, it should be noted that not all combinations of the features explained in the embodiments are essential to means for solving the problems of the invention.

What is claimed is:

1. A zinc-blende nitride semiconductor free-standing substrate, comprising:
    a zinc-blende nitride semiconductor epitaxial layer;
    a front surface, at least 95% of a surface area of said front surface comprising said zinc-blende nitride semiconductor; and
    a back surface opposite the front surface, a distance between the front surface and the back surface being at least 200 µm,
    wherein an As concentration in the front surface is less than an As concentration in the back surface.

2. The zinc-blende nitride semiconductor free-standing substrate according to claim 1, wherein the As concentration in the front surface is not more than $1 \times 10^{19}$ cm$^{-3}$.

3. The zinc-blende nitride semiconductor free-standing substrate according to claim 1, wherein:
    a dislocation density in the front surface is not more than $7 \times 10^6$ cm$^{-2}$.

4. The zinc-blonde nitride semiconductor free-standing substrate according to claim 1, wherein no more than 5% of the surface area of the front surface of said zinc-blende nitride semiconductor free-standing substrate comprises a wurtzite nitride semiconductor.

5. The zinc-blende nitride semiconductor free-standing substrate according to claim 4, wherein no more than 5% of an entire surface of said zinc-blende nitride semiconductor free-standing substrate comprises a wurtzite nitride semiconductor.

6. The zinc-blonde nitride semiconductor free-standing substrate according to claim 1, wherein the zinc-blende nitride semiconductor epitaxial layer comprises a grown single crystal.

7. The zinc-blende nitride semiconductor free-standing substrate according to claim 1, wherein the zinc-blende nitride semiconductor epitaxial layer comprises a single crystal and has a crystal axis aligned with a crystal axis of an underlying single crystal substrate.

* * * * *